(12) United States Patent
Park et al.

(10) Patent No.: US 12,069,922 B2
(45) Date of Patent: Aug. 20, 2024

(54) DISPLAY DEVICE

(71) Applicant: LG Display Co., Ltd., Seoul (KR)

(72) Inventors: JeHyung Park, Daegu (KR); Sangjin Kim, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/209,963

(22) Filed: Jun. 14, 2023

(65) Prior Publication Data

US 2024/0179986 A1 May 30, 2024

(30) Foreign Application Priority Data

Nov. 30, 2022 (KR) ........................ 10-2022-0164118

(51) Int. Cl.
*H10K 59/131* (2023.01)
*G06F 3/041* (2006.01)
*G09G 3/3233* (2016.01)

(52) U.S. Cl.
CPC ....... *H10K 59/1315* (2023.02); *G06F 3/0412* (2013.01); *G09G 3/3233* (2013.01); *G06F 2203/04107* (2013.01); *G09G 2300/0842* (2013.01); *G09G 2300/0861* (2013.01); *G09G 2320/0233* (2013.01); *G09G 2354/00* (2013.01)

(58) Field of Classification Search
CPC ........ G06F 3/0412; G06F 2203/04107; H10K 59/1315; G09G 3/3233; G09G 2300/0842; G09G 2300/0861; G09G 2320/0233; G09G 2354/00

USPC ........................................................ 345/173
See application file for complete search history.

(56) References Cited

U.S. PATENT DOCUMENTS

| | | | |
|---|---|---|---|
| 2011/0242469 A1* | 10/2011 | Kawamura | G02F 1/133512 349/138 |
| 2019/0189720 A1* | 6/2019 | Lim | H10K 59/131 |
| 2021/0181916 A1* | 6/2021 | Kwon | G06F 3/0443 |
| 2022/0130943 A1* | 4/2022 | Wang | H10K 59/1315 |
| 2022/0293051 A1* | 9/2022 | Liu | H01L 27/124 |
| 2023/0240103 A1* | 7/2023 | Yoon | H10K 59/353 257/107 |

FOREIGN PATENT DOCUMENTS

KR 10-2019-0053585 A 5/2019
WO WO-2022205364 A1 * 10/2022

* cited by examiner

*Primary Examiner* — Mark Edwards
(74) *Attorney, Agent, or Firm* — Morgan, Lewis & Bockius LLP

(57) ABSTRACT

The present disclosure relates to a display device. The display device according to an exemplary embodiment of the present disclosure includes a substrate including an active area including a plurality of sub-pixels and a non-active area surrounding the active area; a plurality of transistors disposed in the plurality of sub-pixels, respectively; a plurality of first power supply lines connected to the plurality of sub-pixels; and a plurality of second power supply lines disposed to intersect the plurality of first power supply lines and made of the same material as gate electrodes of the plurality of transistors. Therefore, it is possible to improve the luminance of the display device and suppress the occurrence of mura.

15 Claims, 7 Drawing Sheets

DISPLAY DEVICE

CROSS-REFERENCE TO RELATED APPLICATIONS

This application claims the priority of Korean Patent Application No. 10-2022-0164118 filed on Nov. 30, 2022, in the Korean Intellectual Property Office, the disclosure of which is incorporated herein by reference.

BACKGROUND

Technical Field

The present disclosure relates to a display device, and more particularly, to a display device that has improved luminance and can suppress the occurrence of mura.

Discussion of the Related Art

As an information age enters, the field of display devices for visually displaying electrical information signals is rapidly developing. Thus, studies for developing performances such as thinning, weight reduction, and low power consumption have continued.

Representative examples of the display devices include a liquid crystal display (LCD) device, a field emission display (FED) device, an electro-wetting display (EWD) device, an organic light emitting display (OLED) device, and the like.

An electroluminescence emitting display device represented as the OLED device is a self-emitting display device and does not require a separate light source unlike the LCD device. Thus, the electroluminescence emitting display device can be manufactured in a lightweight and thin form. Further, the electroluminescence emitting display device is not only advantageous in terms of power consumption by low voltage driving, but also has excellent color expression ability, response speed, viewing angle and contrast ratio (CR). Therefore, the electroluminescence emitting display device is expected to be utilized in various fields.

SUMMARY

Accordingly, embodiments of the present disclosure are directed to a display device that substantially obviates one or more of the problems due to limitations and disadvantages of the related art.

An aspect of the present disclosure is to provide a display device with improved luminance uniformity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device includes a substrate including an active area including a plurality of sub-pixels and a non-active area surrounding the active area; a plurality of transistors disposed in the plurality of sub-pixels, respectively; a plurality of first power supply lines connected to the plurality of sub-pixels; and a plurality of second power supply lines disposed to intersect the plurality of first power supply lines and made of the same material as gate electrodes of the plurality of thin-film transistors.

In another aspect, a display device includes a substrate including an active area including a plurality of sub-pixels and a non-active area surrounding the active area; a plurality of transistors disposed in the plurality of sub-pixels, respectively; a plurality of power supply lines connected to the plurality of sub-pixels; and a metal layer intersecting and connected to the plurality of power supply lines in the active area and made of the same material as gate electrodes of the plurality of transistors.

In yet another aspect, a display device includes a substrate including an active area including a plurality of sub-pixels and a non-active area surrounding the active area; a plurality of transistors disposed in the plurality of sub-pixels, respectively; a plurality of power supply lines connected to the plurality of sub-pixels; and a shielding layer disposed to intersect the plurality of power supply lines in the active area and the non-active area and electrically connected to the plurality of power supply lines in the non-active area, wherein the plurality of power supply lines surrounds the substrate in the non-active area.

Other detailed matters of the exemplary embodiments are included in the detailed description and the drawings.

According to the present disclosure, a display device further includes second power supply lines made of the same material as gate electrodes of transistors and disposed to intersect first power supply lines in an active area. Thus, the first power supply lines and the second power supply lines are electrically connected in a mesh form in the active area. Thus, a decrease in luminance caused by an increase in contact resistance can be suppressed, and the luminance uniformity can be improved.

According to the present disclosure, the display device can be applied to a mask-reduction process. Thus, the manufacturing process can be simplified and the manufacturing cost can be reduced.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
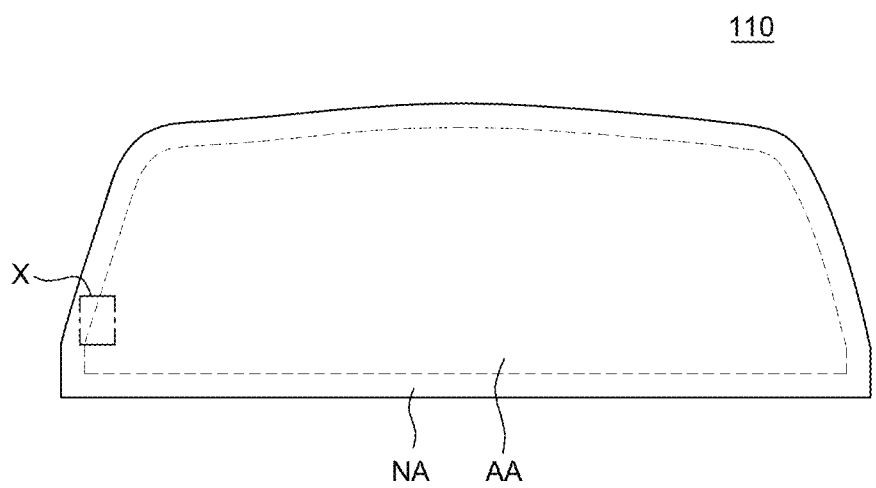
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a schematic plan view of a display device according to an exemplary embodiment of the present disclosure.

For the convenience of description, FIG. 1 illustrates only a substrate 110 among various components of the display device.

The substrate 110 is configured to support various components included in the display device, and may be made of an insulating material. The substrate 110 may be made of a transparent insulating material such as glass or resin. Also, the substrate 110 may be made of a material including polymer or plastic, or may be made of a material having flexibility.

A plurality of sub-pixels is disposed on the substrate 110. A plurality of gate lines and a plurality of data lines may be disposed to intersect on the substrate 110. The plurality of sub-pixels may emit light of respective colors. As each of the plurality of sub-pixels emits light, an image may be displayed. The plurality of sub-pixels may be connected to the gate lines and the data lines, respectively. An area where the plurality of sub-pixels emitting light is disposed may be referred to as an active area AA. Also, an area which is disposed outside the active area AA and in which a plurality of sub-pixels is not disposed may be referred to as a non-active area NA.

In the active area AA, a display unit for displaying an image and a circuit unit for driving the display unit may be formed. For example, if the display device is an OLED device, the display unit may include light emitting diodes (LEDs). That is, the display unit may include an anode, an organic emission layer on the anode and a cathode on the organic emission layer. The organic emission layer may be composed of, for example, a hole transport layer, a hole injection layer, the organic emission layer, an electron injection layer and an electron transport layer. However, if the display device is an LCD device, the display unit may be configured including a liquid crystal layer. Hereinafter, for the convenience of description, the display device will be described as an OLED device, but is not limited thereto.

The circuit unit may include various transistors, capacitors and lines for driving the LEDs. For example, the circuit unit may be composed of various components such as a driving transistor, a switching transistor, a storage capacitor, a gate line and a data line, but is not limited thereto.

The non-active area NA is an area where an image is not displayed.

The non-active area NA may be bent so that it may not be seen from the front or may be covered by a case (not shown), and may also be referred to as a bezel area.

As illustrated in FIG. 1, the non-active area NA may be defined as an area surrounding the active area AA, but is not limited thereto. The non-active area NA may be defined as an area extending from the active area AA. Also, the non-active area NA may also be defined as an area extending from a plurality of sides of the active area AA.

Although FIG. 1 illustrates that the non-active area NA surrounds a curved outer periphery of the active area AA, the shape and layout of the active area AA and the non-active area NA are not limited thereto. That is, the active area AA and the non-active area NA may be designed suitable for an electronic device equipped with a flexible display device. For example, if the display device is applied to a part of a windshield or the entire windshield of a car that a driver or passenger looks at, the edges of the active area AA and the non-active area NA may be curved rather than linear as in the windshield of the car. However, the present disclosure is not limited thereto. The active area AA may be, for example, rectangular, pentagonal, hexagonal, circular, oval, and the like.

In the non-active area NA, various lines and circuits for driving organic LED in the active area AA may be disposed. For example, a link line for transmitting signals to the plurality of sub-pixels and circuits in the active area AA, a gate-in-panel (GIP) line, a power supply line supplying a driving voltage VDD (see FIG. 2) that transmits a power voltage to the sub-pixels, or a driving IC such as a gate driver IC or a data driver IC may be disposed in the non-active area NA. However, the present disclosure is not limited thereto.

In some exemplary embodiments, the power supply line may be disposed in the non-active area NA. The power supply line may be disposed on the substrate 110 corresponding to the non-active area NA along an outer periphery of the substrate 110. For example, the power supply line may be disposed to surround the substrate 110.

In some exemplary embodiments, the power supply line may be connected to a shielding layer that is disposed in at least a part of the non-active area NA and serves to shield light. For example, the shielding layer may be disposed to cross the active area AA and the non-active area NA. The shielding layer may be disposed to intersect the plurality of power supply lines in the active area AA and the non-active area NA and electrically connected to the plurality of power supply lines in the non-active area NA. In this case, the power supply line may overlap at least a part of the shielding layer in at least a part of the non-active area NA. The power supply line may be connected to the shielding layer in an overlapping area therebetween. A contact hole may be formed in a connection area between the power supply line and the shielding layer, and the power supply line may be connected to the shielding layer through the contact hole. The present invention may further include a metal layer intersecting and connected to the plurality of power supply lines in the active area AA and made of the same material as gate electrodes of a plurality of transistors disposed in a plurality of sub-pixels respectively. The shielding layer may be disposed under the metal layer, and may be electrically connected to the metal layer in the non-active area NA.

Also, not illustrated in the drawings, a touch sensing unit including a plurality of touch electrodes may be included in the display device. In the plurality of touch electrodes, touch routing lines for transmitting touch signals may be disposed.

The display device may further include various additional components for generating various signals or driving pixels disposed in the active area AA. The additional components for driving the pixels may include an inverter circuit, a multiplexer, an electro static discharge (ESD) circuit, etc. The display device may also include additional components associated with sensing functionalities other than for driving the pixels. For example, the display device may further include additional components for providing a touch sensing functionality, a user authentication functionality (e.g., finger print scan), a multi-level pressure sensing functionality, a tactile feedback functionality, etc. The above-described additional components may be located in the non-active area NA and/or an external circuit connected to a connection interface.

Hereinafter, a pixel circuit of the plurality of sub-pixels of the display device will be described in more detail with reference to FIG. 2.

Figure 2:
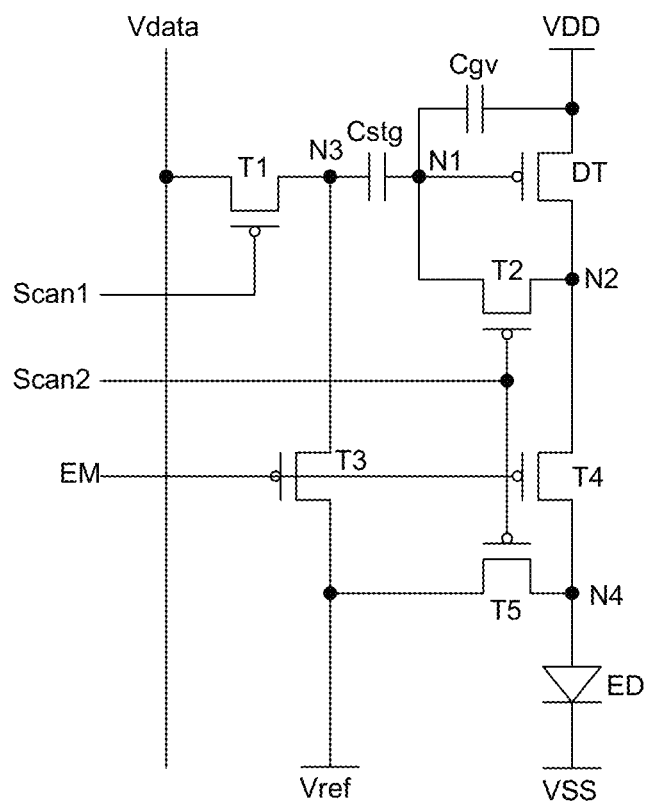
FIG. 2 is an equivalent circuit diagram illustrating a structure of a sub-pixel according to an exemplary embodiment of the present disclosure.

FIG. 2 is an equivalent circuit diagram illustrating a structure of a sub-pixel according to an exemplary embodiment of the present disclosure.

Referring to FIG. 2, each of the plurality of sub-pixels disposed in the active area AA of the display device includes an LED ED and a pixel driving circuit for driving the LED ED. The pixel driving circuit includes a driving transistor DT, first to fifth transistors T1 to T5 and a storage capacitor Cstg.

The LED ED emits light in response to a driving current supplied from the driving transistor DT. The LED ED may include a plurality of organic compound layers disposed between an anode electrode and a cathode electrode. The anode electrode may be a pixel electrode disposed in each sub-pixel, and the driving transistor DT of each sub-pixel may be electrically connected to a second node N2. The cathode electrode may be a common electrode commonly disposed in the plurality of sub-pixels and may be applied with a driving voltage VDD. The organic compound layers may include at least one hole transport layer, at least one electron transport layer and an emission layer (EML). Herein, the hole transport layer serves to inject or transport holes into the EML, and may be, for example, a hole injection layer (HIL), a hole transport layer (HTL), an electron blocking layer (EBL), and the like. Further, the electron transport layer serves to inject or transport electrons into the EML, and may be, for example, an electron transport layer (EIL), an electron injection layer (EIL), a hole blocking layer (HBL), and the like. The anode electrode of the LED ED is connected to a fourth node N4, and the cathode electrode of the LED ED is connected to an input terminal of a low-potential driving voltage VSS.

For example, the anode electrode may be a pixel electrode and the cathode electrode may be a common electrode. In contrast, the anode electrode may be a common electrode and the cathode electrode may be a pixel electrode. In the following, for the convenience of description, it is assumed that the anode electrode will be described as a pixel electrode and the cathode electrode will be described as a common electrode.

For example, the LED ED may be an organic light emitting diode (OLED), an inorganic LED, a quantum dot LED, or the like. In this case, if the LED ED is an OLED, an emission layer EML of the LED ED may include an organic emission layer including an organic material.

The driving transistor DT controls a driving current applied to the LED ED in response to a source-gate voltage Vsg of the driving transistor DT. A source electrode of the driving transistor DT is connected to a driving voltage VDD line, a gate electrode is connected to a first node N1, and a drain electrode is connected to the second node N2.

The first transistor T1 includes a source electrode connected to a data line, a drain electrode connected to a third node N3, and a gate electrode applied with a first scan signal Scan1. As a result, the first transistor T1 applies a data voltage Vdata supplied from the data line to the third node N3, which is the gate electrode of the driving transistor DT, in response to the first scan signal Scan1.

The second transistor T2 includes a source electrode connected to the second node N2, a drain electrode connected to the first node N1, and a gate electrode applied with a second scan signal Scan2. The second transistor T2 diode-connects the gate electrode and the drain electrode of the driving transistor DT in response to the second scan signal Scan2.

The third transistor T3 includes a source electrode connected to an input terminal of a reference voltage Vref, a drain electrode connected to the third node N3, and a gate electrode applied with an emission signal EM. As a result, the third transistor T3 applies the reference voltage Vref to the third node N3 in response to the emission signal EM.

The fourth transistor T4 includes a source electrode connected to the second node N2, a drain electrode connected to the fourth node N4 and a gate electrode applied with the emission signal EM. The fourth transistor T4 forms a current path between the second node N2, which is the source electrode of the fourth transistor T4, and the fourth node N4, which is the drain electrode of the fourth transistor T4, in response to the emission signal EM. That is, the fourth transistor T4 forms a current path between the driving transistor DT and the LED ED in response to the emission signal EM.

The fifth transistor T5 includes a drain electrode connected to the fourth node N4, a source electrode connected to the input terminal of the reference voltage Vref and a gate electrode applied with the second scan signal Scan2. The fifth transistor T5 applies the reference voltage Vref to the fourth node N4 in response to the second scan signal Scan2.

The storage capacitor Cstg includes a first electrode connected to the first node N1 and a second electrode connected to the third node N3. The storage capacitor Cstg is charged with the data voltage Vdata, which has been compensated for a threshold voltage Vth of the driving transistor DT. Accordingly, the data voltage Vdata is compensated for the threshold voltage Vth of the driving transistor DT, and, thus, a characteristic deviation of the driving transistor DT between sub-pixels can be compensated for.

For example, each sub-pixel may further include an auxiliary capacitor Cgv.

The auxiliary capacitor Cgv is connected between the driving voltage VDD line and the first node N1. The auxiliary capacitor Cgv suppresses a change in voltage of the gate electrode of the driving transistor DT caused by undesired coupling.

Each sub-pixel may have a structure including six transistors DT and T1 to T5 and one capacitor Cstg as shown in FIG. 2, but is not limited thereto. In some cases, each sub-pixel may further include one or more transistors, or may further include one or more capacitors.

Figure 3:
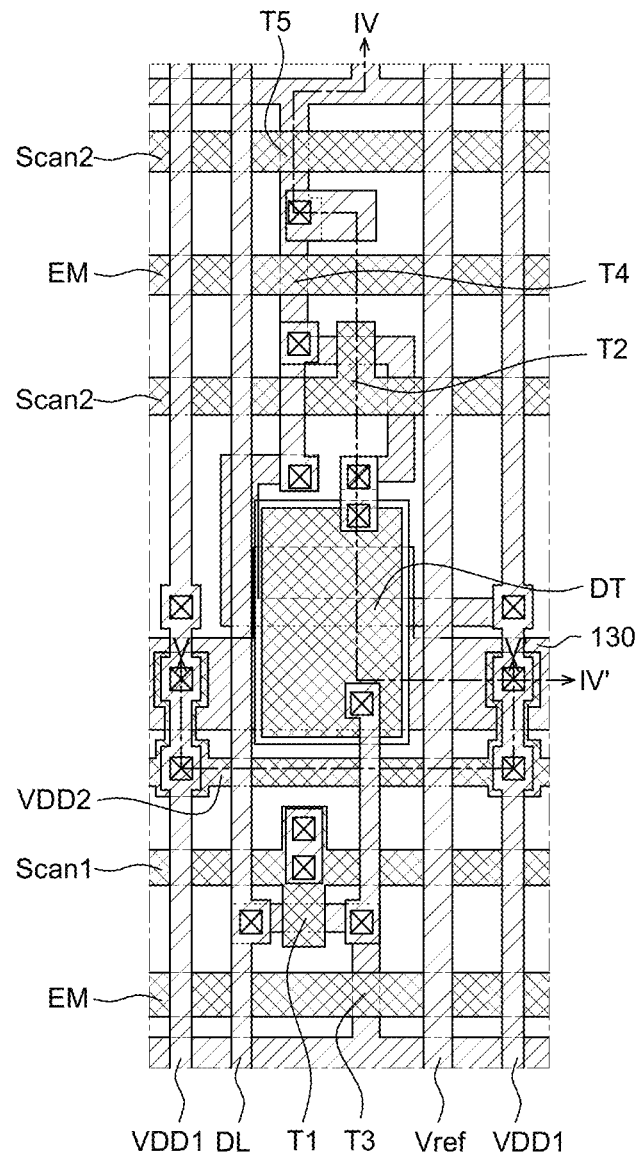
FIG. 3 is a schematic plan view of the sub-pixel of FIG. 2.
Figure 4:
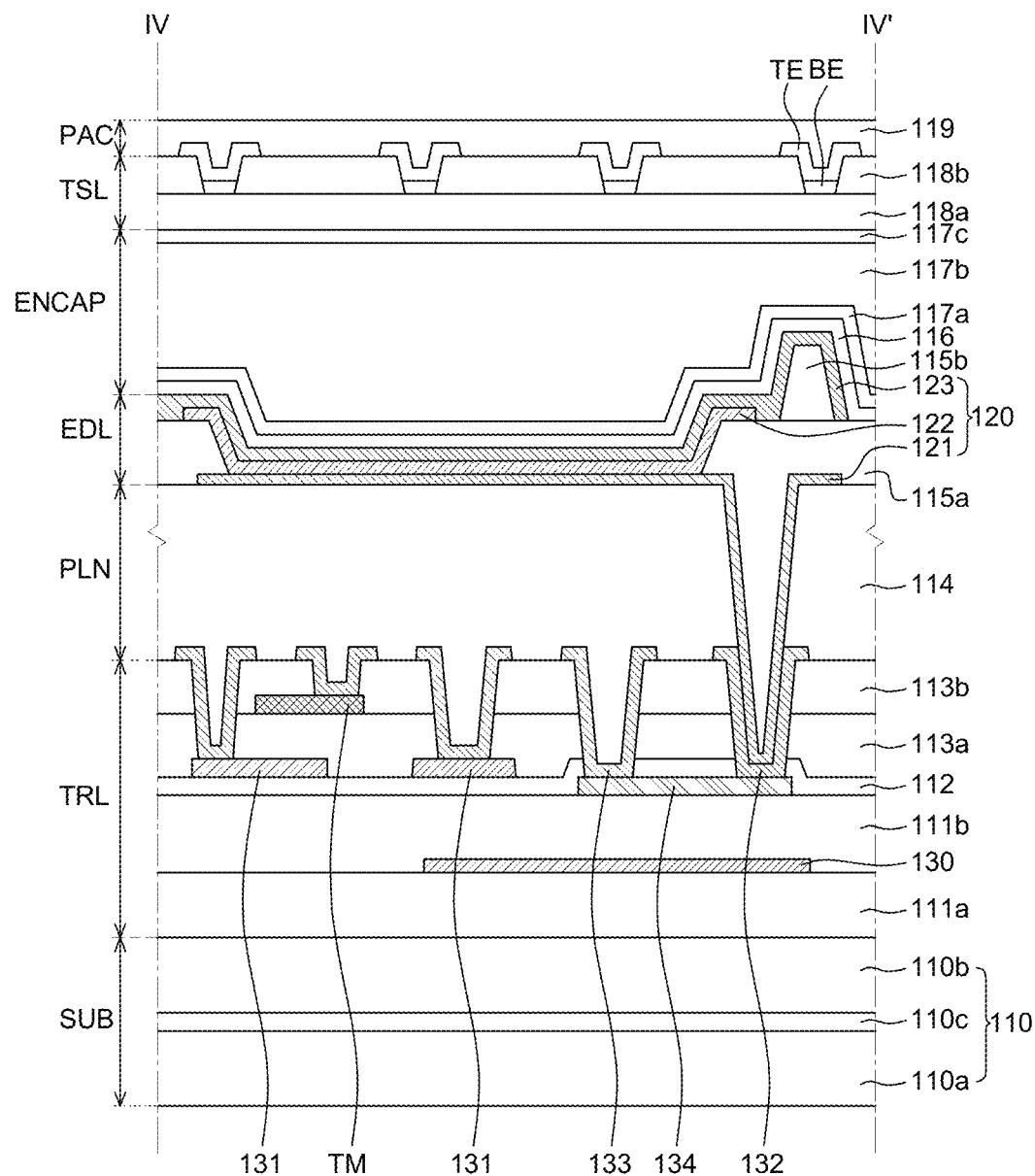
FIG. 4 is a cross-sectional view as taken along a line IV-IV' of FIG. 3.
Figure 5:
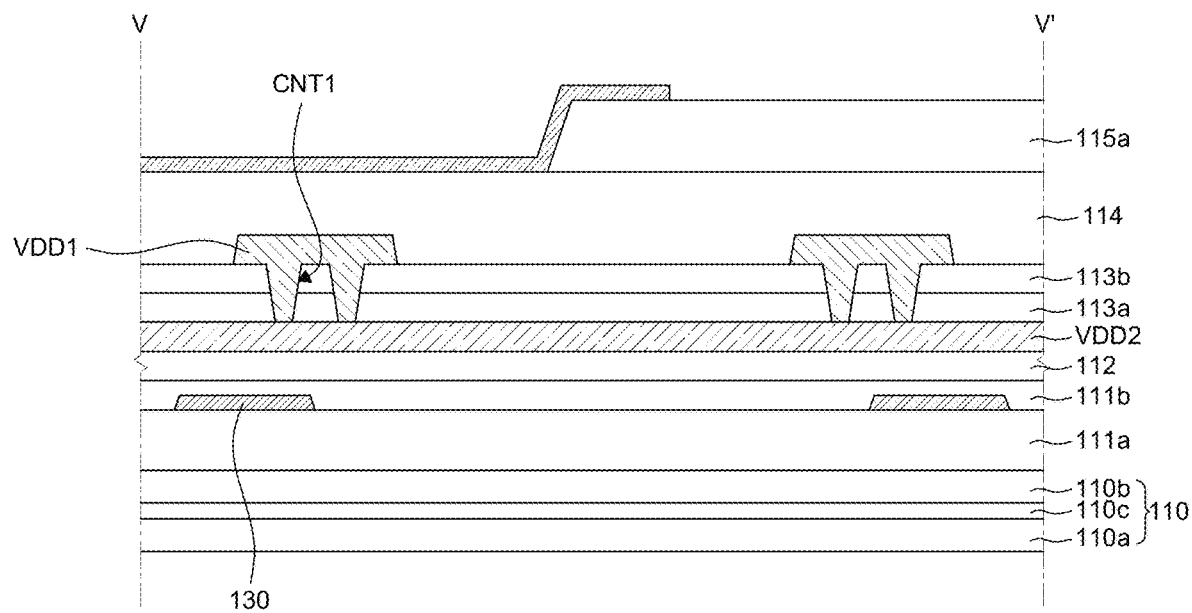
FIG. 5 is a cross-sectional view as taken along a line V-V' of FIG. 3.

FIG. 3 is a schematic plan view of the sub-pixel of FIG. 2. FIG. 4 is a cross-sectional view as taken along a line IV-IV' of FIG. 3. FIG. 5 is a cross-sectional view as taken along a line V-V' of FIG. 3.

Referring to FIG. 3, the first transistor T1, the second transistor T2, the third transistor T3, the fourth transistor T4, the fifth transistor T5, the driving transistor DT and the storage capacitor Cstg are disposed in each sub-pixel.

Also, in each sub-pixel, a first power supply line VDD1 configured to transmit a high-potential power voltage and a second power supply line VDD2 disposed to intersect the first power supply line VDD1 and configured to supply a power voltage to the sub-pixel may be disposed. Further, in each sub-pixel, a data line DL configured to transmit a data voltage and a first scan line Scan1 configured to transmit a first scan signal may be disposed. Furthermore, in each sub-pixel, a second scan line Scan2 configured to transmit a second scan signal, an emission control signal line EM configured to transmit an emission control signal and a reference voltage Vref line configured to transmit a reference voltage may be disposed. The first transistor T1, the second transistor T2, the third transistor T3, the fourth transistor T4, the fifth transistor T5, the driving transistor DT and the storage capacitor Cstg have been described above with reference to FIG. 2. Therefore, a redundant description will be omitted. However, a plan layout of the first transistor T1, the second transistor T2, the third transistor T3, the fourth transistor T4, the fifth transistor T5, the driving transistor DT and the storage capacitor Cstg is not limited to the exemplary embodiment shown in FIG. 3, and may be changed in various ways.

Hereinafter, a cross-sectional structure of each sub-pixel will be described in more detail with reference to FIG. 4 and FIG. 5.

Referring to FIG. 4, the display device according to an exemplary embodiment of the present disclosure may include a transistor layer TRL on a substrate SUB and a planarization layer PLN on the transistor layer TRL. Also, an LED layer EDL may be disposed on the planarization layer PLN, and an encapsulation layer ENCAP may be disposed on the LED layer EDL. Further, a touch sensing layer TSL may be disposed on the encapsulation layer ENCAP, and a protective layer PAC may be disposed on the touch sensing layer TSL.

The substrate SUB is configured to support various components included in the display device, and may be made of an insulating material. The substrate (SUB) 110 may include a first substrate 110a, a second substrate 110b and an interlayer insulating film 110c. The interlayer insulating film 110c may be disposed between the first substrate 110a and the second substrate 110b. As such, the substrate SUB is composed of the first substrate 110a, the second substrate 110b and the interlayer insulating film 110c and thus may suppress permeation of moisture. For example, the first substrate 110a and the second substrate 110b may be polyimide (PI) substrates.

In the transistor layer TRL, various patterns 131, 132, 133 and 134, various insulating films 111a, 111b, 112, 113a and 113b, and a metal pattern TM for forming a transistor such as a driving transistor DT may be disposed.

Hereinafter, a laminated structure of the transistor layer TRL will be described in more detail.

A multi-buffer layer 111a may be disposed on the second substrate 110b, and an active buffer layer 111b may be disposed on the multi-buffer layer 111a. A shielding layer 130 may be disposed on the multi-buffer layer 111a. Herein, the shielding layer 130 may serve to shield light.

In some exemplary embodiments, the shielding layer 130 may be made of a material that shields light. For example, the shielding layer 130 may be made of an opaque metal material, but is not limited thereto.

The active buffer layer 111b may be disposed on the shielding layer 130. An active layer 134 of the driving transistor DT may be disposed on the active buffer layer 111b. For example, the active layer 134 may be made of polysilicon (p-Si), amorphous silicon (a-Si) or an oxide semiconductor, but is not limited thereto.

A gate insulating film 112 may be disposed on the active layer 134. The gate insulating film 112 may be made of silicon oxide (SiOx), silicon nitride (SiNx) or a multilayer thereof.

Also, a gate electrode 131 of the driving transistor DT may be disposed on the gate insulating film 112. The gate electrode 131 may be made of various conductive materials such as magnesium (Mg), aluminum (Al), nickel (Ni), chromium (Cr), molybdenum (Mo), tungsten (W), gold (Au) or an alloy thereof, but is not limited thereto.

A first interlayer insulating film 113a may be disposed on the gate electrode 131. The metal pattern TM may be disposed on the first interlayer insulating film 113a. A second interlayer insulating film 113b may be disposed to cover the metal pattern TM disposed on the first interlayer insulating film 113a.

A source electrode 132 and a drain electrode 133 of the driving transistor DT may be disposed on the second interlayer insulating film 113b.

The source electrode 132 and the drain electrode 133 may be connected to one side and the other side, respectively, of the active layer 134 through a contact hole formed in the second interlayer insulating film 113*b*, the first interlayer insulating film 113*a* and the gate insulating film 112. The source electrode 132 and the drain electrode 133 may be made of various conductive materials such as magnesium (Mg), aluminum (Al), nickel (Ni), chromium (Cr), molybdenum (Mo), tungsten (W), gold (Au) or an alloy thereof, but is not limited thereto.

Although not illustrated in the drawings, a passivation layer for protecting the driving transistor DT may be disposed on the source electrode 132 and the drain electrode 133, but the present disclosure is not limited thereto.

The planarization layer PLN may be located on the transistor layer TRL. The planarization layer (PLN) 114 protects the driving transistor DT and planarizes an upper portion of the driving transistor DT. The LED layer EDL may be located on the planarization layer 114.

Hereinafter, a laminated structure of the LED layer EDL will be described in detail.

An anode 121 may be disposed on the planarization layer 114. In this case, the anode 121 may be electrically connected to the source electrode 132 of the driving transistor DT through a contact hole formed in the planarization layer 114. The anode 121 may be made of a metallic material.

If the display device is of a top emission type in which light generated from an LED 120 is emitted to above the substrate SUB on which the LED 120 is disposed, the anode 121 may further include a transparent conductive layer and a reflective layer on the transparent conductive layer. The transparent conductive layer may be made of a transparent conductive oxide such as ITO, IZO, etc. The reflective layer may be made of, for example, silver (Ag), aluminum (Al), gold (Au), molybdenum (Mo), tungsten (W), chromium (Cr) or an alloy thereof.

A bank 115*a* may be disposed to cover the anode 121. A part of the bank 115*a* corresponding to an emission area of a sub-pixel may be opened. A part of the anode 121 may be exposed through the open part (hereinafter, referred to as "open area") of the bank 115*a*. In this case, the bank 115*a* may be made of an inorganic insulating material such as silicon nitride (SiNx) or silicon oxide (SiOx) or an organic insulating material such as benzocyclobutene-based resin, acryl-based resin or imide-based resin. However, the bank 115*a* is not limited thereto.

A spacer 115*b* may be disposed on the bank 115*a*. The spacer 115*b* may be made of the same material as the bank 115*a*. An emission layer 122 may be disposed on and around the open area of the bank 115*a*. Therefore, the emission layer 122 may be disposed on the anode 121 exposed through the open area of the bank 115*a*. A cathode 123 may be disposed on the emission layer 122. The LED 120 may be composed of the anode 121, the emission layer 122 and the cathode 123. The emission layer 122 may include a plurality of organic films.

A protective layer 116 may be located on the LED layer EDL. For example, the protective layer 116 may be deposited through an atomic layer deposition (ALD) process, and may serve to block permeation of moisture or oxygen into the LED 120. The encapsulation layer ENCAP may be located on the protective layer 116. The encapsulation layer ENCAP may have a monolayer structure or a multilayer structure. For example, the encapsulation layer ENCAP may include a first encapsulation layer 117*a*, a second encapsulation layer 117*b* and a third encapsulation layer 117*c*.

In this case, the first encapsulation layer 117*a* and the third encapsulation layer 117*c* may be configured as inorganic films, and the second encapsulation layer 117*b* may be configured as an organic film. Among the first encapsulation layer 117*a*, the second encapsulation layer 117*b* and the third encapsulation layer 117*c*, the second encapsulation layer 117*b* has the greatest thickness and may serve as a planarization layer.

The first encapsulation layer 117*a* is disposed on the cathode 123, and may be disposed most adjacent to the LED 120. The first encapsulation layer 117*a* may be made of an inorganic insulating material suitable for low temperature deposition. For example, the first encapsulation layer 117*a* may be made of silicon nitride (SiNx), silicon oxide (SiOx), silicon oxynitride (SiON) or aluminum oxide ($Al_2O_3$). Since the first encapsulation layer 117*a* is deposited in a low temperature atmosphere, damage to the emission layer 122 including an organic material vulnerable to a high temperature atmosphere may be suppressed during the deposition process.

The second encapsulation layer 117*b* may be formed smaller in size than the first encapsulation layer 117*a*. In this case, the second encapsulation layer 117*b* may be formed to expose both ends of the first encapsulation layer 117*a*. The second encapsulation layer 117*b* may serve as a buffer for relieving the stress between the layers when the flexible display device is bent and enhance the planarization performance.

For example, the second encapsulation layer 117*b* may be made of an organic insulating material such as acrylic resin, epoxy resin, polyimide, polyethylene or silicon oxycarbon (SiOC). For example, the second encapsulation layer 117*b* may be formed by an inkjet printing method, but is not limited thereto.

The third encapsulation layer 117*c* may be formed to cover upper surfaces and side surfaces of the second encapsulation layer 117*b* and the first encapsulation layer 117*a* on the substrate SUB on which the second encapsulation layer 117*b* is formed. In this case, the third encapsulation layer 117*c* may minimize or block permeation of moisture or oxygen from the outside into the first encapsulation layer 117*a* and the second encapsulation layer 117*b*. For example, the third encapsulation layer 117*c* may be made of an inorganic insulating material such as silicon nitride (SiNx), silicon oxide (SiOx), silicon oxynitride (SiON) or aluminum oxide ($Al_2O_3$).

The touch sensing layer TSL may be disposed on the encapsulation layer ENCAP described above.

A touch buffer film 118*a* may be disposed on the encapsulation layer ENCAP, and a touch metal may be disposed on the touch buffer film 118*a*.

The touch metal may include a touch sensor metal TE and a bridge metal BE located on different layers. A touch interlayer insulating film 118*b* may be disposed between the touch sensor metal TE and the bridge metal BE.

For example, the touch sensor metal TE may include a first touch sensor metal, a second touch sensor metal and a third touch sensor metal disposed adjacent to each other. The first touch sensor metal and the second touch sensor metal are electrically connected to each other. However, if the third touch sensor metal is interposed between the first touch sensor metal and the second touch sensor metal, the first touch sensor metal and the second touch sensor metal may be electrically connected to each other through the bridge metal BE on a different layer. The bridge metal BE may be insulated from the third touch sensor metal by the touch interlayer insulating film 118*b*.

When the touch sensing layer TSL is formed, a chemical solution (a developing solution, etching solution, or the like) may be used for the process or moisture may be generated from the outside. The touch buffer film 118a is provided and the touch sensing layer TSL is disposed thereon. Therefore, it is possible to suppress permeation of the chemical solution or moisture into the emission layer 122 including an organic material while the touch sensing layer TSL is manufactured. Accordingly, the touch buffer film 118a may suppress damage to the emission layer 122 vulnerable to the chemical solution or moisture.

The touch buffer film 118a may be made of an organic insulating material that may be formed at a low temperature of a predetermined temperature (e.g., 100° C.) or less and has a low dielectric constant of 1 to 3. This is to suppress damage to the emission layer 122 including an organic material vulnerable to high temperature. For example, the touch buffer film 118a may be made of an acryl-, epoxy- or siloxane-based material. As the flexible display device is bent, the encapsulation layer ENCAP may be damaged and a touch sensor metal TE located on the touch buffer film 118a may be broken. Even if the flexible display device is bent, the touch buffer film 118a made of an organic insulating material and having the planarization performance may suppress damage to the encapsulation layer ENCAP and breakage of the metals TE and BE of the touch metal.

The protective layer (PAC) 119 may be disposed to cover a touch metal. The protective layer 119 may be configured as an organic insulating film. The protective layer 119 may compensate for a step difference caused by the touch sensing layer TSL disposed under the protective layer 119. Thus, it is possible to reduce the occurrence of mura which is caused by the touch sensing layer TSL and may be seen by a user.

Hereinafter, a plurality of power supply lines VDD1 and VDD2 disposed in the active area AA of the display device will be described in more detail with reference to FIG. 5.

Referring to FIG. 5, a plurality of first power supply lines VDD1 and a plurality of second power supply lines VDD2 are disposed on the substrate 110 in the active area AA. Specifically, the second power supply line VDD2 is disposed on the gate insulating film 112, and one or more first insulating layers 113a and 113b are disposed on the second power supply line VDD2. Also, the first power supply line VDD1 is disposed on the one or more first insulating layers 113a and 113b. Referring to FIG. 3 together, the plurality of first power supply lines VDD1 and the plurality of second power supply lines VDD2 are disposed to intersect each other and electrically connected to each other at the respective intersections. For example, the plurality of first power supply lines VDD1 and the plurality of second power supply lines VDD2 are disposed to intersect each other and thus may be disposed in a mesh form.

The plurality of first power supply lines VDD1 may be disposed in parallel to a data line (e.g., the data line DL of FIG. 3). For example, the plurality of first power supply lines VDD1 may be disposed to extend in a direction parallel to the data line. The plurality of first power supply lines VDD1 may be formed on the same layer as the source electrode 132 and/or the drain electrode 133 of the driving transistor DT. The plurality of first power supply lines VDD1 may be formed of the same material as the source electrode 132 and/or the drain electrode 133 of the driving transistor DT. For example, the plurality of first power supply lines VDD1 may be formed of the same material on the same layer as the source electrode 132 and/or the drain electrode 133 of the driving transistor DT.

The plurality of second power supply lines VDD2 may extend in a different direction from the first power supply line VDD1. For example, the plurality of second power supply lines VDD2 may extend in a direction perpendicular to the plurality of first power supply lines VDD1. The plurality of second power supply lines VDD2 may be formed on the same layer as the gate electrode 131 of the driving transistor DT. The plurality of second power supply lines VDD2 may be formed of the same material as the gate electrode 131 of the driving transistor DT. For example, the plurality of second power supply lines VDD2 may be formed of the same material on the same layer as the gate electrode 131 of the driving transistor DT.

The plurality of first power supply lines VDD1 and the plurality of second power supply lines VDD2 may be electrically connected to each other through a first contact hole CNT1 included in the one or more first insulating layers 113a and 113b in the active area AA. If the plurality of power supply lines VDD1 and VDD2 is disposed to intersect each other in a mesh form, crosstalk may be reduced compared to a case where the plurality of power supply lines extends in only one direction.

In some exemplary embodiments, a plurality of power supply lines may be electrically connected to a shielding layer so as to be disposed to intersect each other in a mesh form in an active area of a display device. In this case, if the number of masks is reduced to reduce processing cost and processing time, a part of the shielding layer may be etched together when a contact hole for connecting the plurality of power supply lines to the shielding layer is formed in the active area. If a part of the shielding layer is etched, not only an upper surface of the shielding layer but also side surfaces of the shielding layer may be contacted with the plurality of power supply lines. Thus, a contact error may occur. If such a contact error occurs, a sampling voltage of a driving transistor increases compared to a case where a contact error does not occur. Therefore, a gate-source voltage Vsg of the driving transistor decreases, and, thus, the luminance may decrease and dark mura may occur.

In the display device according to an exemplary embodiment of the present disclosure, the second power supply line VDD2 made of the same material as the gate electrode 131 of the driving transistor DT is electrically connected to the first power supply line VDD1 in the active area AA. Thus, the plurality of first power supply lines VDD1 and the plurality of second power supply lines VDD2 are electrically connected to each other in a mesh form.

The plurality of second power supply lines VDD2 may be formed in the same process at the same time as the gate electrode 131 of the driving transistor DT. Thus, there is no need to add a separate process and a separate mask for forming the plurality of second power supply lines VDD2. Therefore, even if the plurality of second power supply lines VDD2 is further formed, there is no increase in manufacturing cost and processing time.

According to an exemplary embodiment of the present disclosure, the shielding layer 130 may be provided between the substrate 110 and an active layer 134 of the driving transistor DT and disposed to intersect the plurality of first power supply lines VDD1.

According to an exemplary embodiment of the present disclosure, the plurality of first power supply lines VDD1 is electrically connected to the plurality of second power supply lines VDD2 disposed between the plurality of first power supply lines VDD1 and the shielding layer 130.

Accordingly, any contact hole is not disposed between the plurality of first power supply lines VDD1 and the shielding layer 130 in the active area AA. Therefore, according to the present disclosure, non-uniformity in luminance in the active area AA may be solved.

Hereinafter, the plurality of power supply lines disposed between the active area AA and the non-active area NA of the display device will be described in more detail with reference to FIG. 6 and FIG. 7.

Figure 6:
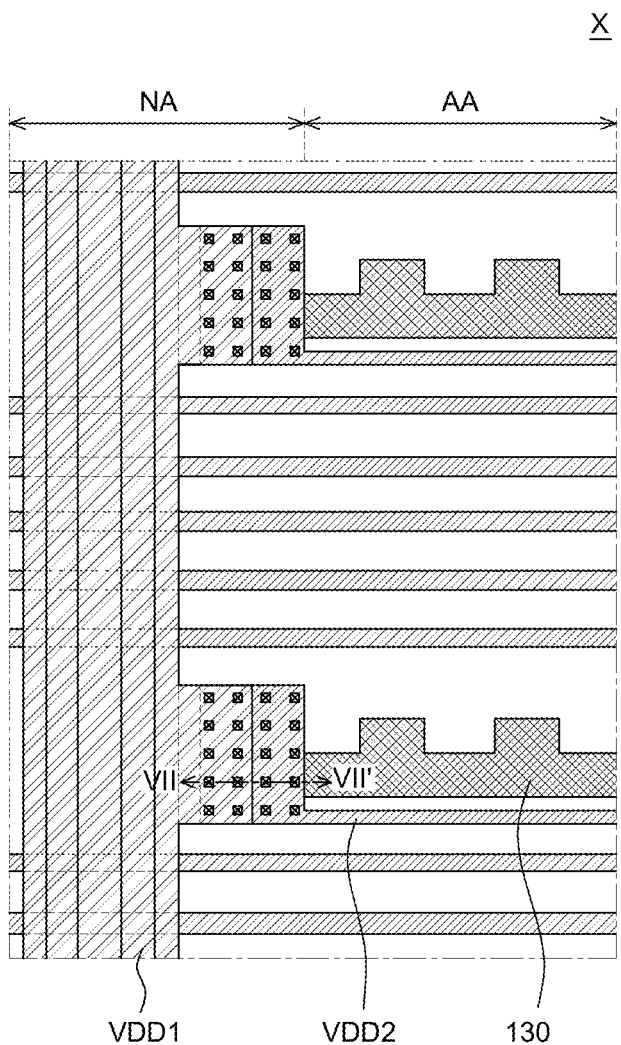
FIG. 6 is a schematic plan view of an area X of FIG. 1.

FIG. 6 is a schematic plan view of an area X of FIG. 1. FIG. 7 is a cross-sectional view as taken along a line VII-VII' of FIG. 6.

Figure 7:
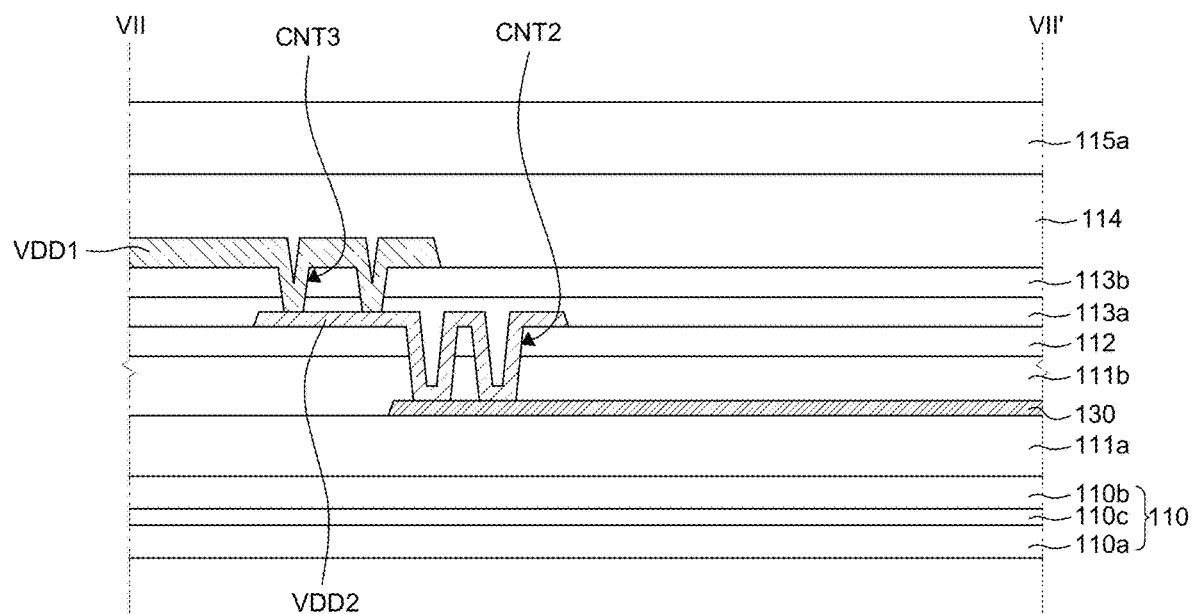
FIG. 7 is a cross-sectional view as taken along a line VII-VII' of FIG. 6.

FIG. 6 and FIG. 7 are provided to show connections of the plurality of first power supply lines VDD1 disposed in the non-active area NA. For the convenience of description, FIG. 6 and FIG. 7 illustrate only the plurality of first power supply lines VDD1, the plurality of second power supply lines VDD2 and the shielding layer 130 among the components of the display device, and a redundant description will be omitted.

A driving circuit referred to as a GIP (Gate in Panel) circuit may be disposed in an area away from the active area AA based on the plurality of first power supply lines VDD1 disposed in the non-active area NA. However, the present disclosure is not limited thereto.

According to an exemplary embodiment of the present disclosure, one or more second insulating layers 111b and 112 may be further provided between the shielding layer 130 and the plurality of second power supply lines VDD2. For example, the second insulating layers 111b and 112 may include the active buffer layer 111b and the gate insulating film 112.

The one or more second insulating layers 111b and 112 may include a plurality of second contact holes CNT2 disposed in the non-active area NA. The plurality of second power supply lines VDD2 and the shielding layer 130 may be electrically connected to each other through the second contact holes CNT2 disposed in the non-active area NA.

According to an exemplary embodiment of the present disclosure, the one or more first insulating layers 113a and 113b disposed between the plurality of first power supply lines VDD1 and the plurality of second power supply lines VDD2 may include a plurality of third contact holes CNT3 disposed in the non-active area NA.

The plurality of first power supply lines VDD1 and the plurality of second power supply lines VDD2 may be electrically connected to each other through the third contact holes CNT3.

The plurality of first power supply lines VDD1 and the plurality of second power supply lines VDD2 may be electrically connected to each other through the plurality of third contact holes CNT3 of the one or more first insulating layers 113a and 113b in the non-active area NA.

That is, according to an exemplary embodiment of the present disclosure, in the non-active area NA, the shielding layer 130 may be electrically connected to the plurality of second power supply lines VDD2. Also, the shielding layer 130 may be electrically connected to the plurality of first power supply lines VDD1 through the plurality of second power supply lines VDD2.

According to an exemplary embodiment of the present disclosure, in the non-active area NA, the shielding layer 130 may be electrically connected to the plurality of first power supply lines VDD1. Also, in the active area AA, the shielding layer 130 is electrically disconnected from the plurality of first power supply lines VDD1. Thus, it is possible to suppress non-uniformity in luminance in the active area AA caused by an increase in contact resistance.

Further, in the active area AA, the plurality of first power supply lines VDD1 and the plurality of second power supply lines VDD2 are electrically connected to each other in a mesh form. Thus, it is possible to reduce moving crosstalk which may occur in the active area AA.

The exemplary embodiments of the present disclosure can also be described as follows.

According to an aspect of the present disclosure, a display device, comprising: a substrate including an active area including a plurality of sub-pixels and a non-active area surrounding the active area, a plurality of transistors disposed in the plurality of sub-pixels, respectively, a plurality of first power supply lines connected to the plurality of sub-pixels, and a plurality of second power supply lines disposed to intersect the plurality of first power supply lines and made of the same material as gate electrodes of the plurality of transistors.

The display device may further include one or more first insulating layers disposed between the plurality of first power supply lines and the plurality of second power supply lines, the plurality of first power supply lines and the plurality of second power supply lines are electrically connected to each other through a plurality of first contact holes of the one or more first insulating layers in the active area.

The display device may further include a shielding layer disposed between the substrate and an active layer of a driving transistor among the plurality of transistors and disposed to intersect the plurality of first power supply lines.

The display device may further include one or more second insulating layers disposed between the shielding layer and the plurality of second power supply lines, the shielding layer and the plurality of second power supply lines are electrically connected through a plurality of second contact holes of the one or more second insulating layers in the non-active area.

The plurality of first power supply lines and the plurality of second power supply lines may be electrically connected to each other through a plurality of third contact holes of the one or more first insulating layers in the non-active area.

Each of the plurality of sub-pixels may include a pixel driving circuit including an LED, a driving transistor, first to fifth transistors and a storage capacitor.

In the non-active area, the plurality of first power supply lines may surround the substrate.

According to an another aspect of the present disclosure, a display device, comprising: a substrate including an active area including a plurality of sub-pixels and a non-active area surrounding the active area, a plurality of transistors disposed in the plurality of sub-pixels, respectively, a plurality of power supply lines connected to the plurality of sub-pixels, and a metal layer intersecting and connected to the plurality of power supply lines in the active area and made of the same material as gate electrodes of the plurality of transistors.

The display device may further include a shielding layer disposed under the metal layer, the shielding layer is electrically connected to the metal layer in the non-active area.

The shielding layer may be electrically connected to the plurality of power supply lines in the non-active area.

In the non-active area, the plurality of power supply lines may surround the substrate.

According to an yet another aspect of the present disclosure, a display device, comprising: a substrate including an active area including a plurality of sub-pixels and a non-active area surrounding the active area, a plurality of transistors disposed in the plurality of sub-pixels, respectively, a plurality of power supply lines connected to the plurality of sub-pixels, and a shielding layer disposed to intersect the plurality of power supply lines in the active area and the non-active area and electrically connected to the plurality of power supply lines in the non-active area, the plurality of power supply lines surrounds the substrate in the non-active area.

The display device may further include a metal layer intersecting and connected to the plurality of power supply lines in the active area and made of the same material as gate electrodes of the plurality of transistors.

The plurality of power supply lines may be made of the same material as a source electrode or a drain electrode of a driving transistor among the plurality of transistors.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including an active area including a plurality of sub-pixels and a non-active area surrounding the active area;
   a plurality of transistors disposed in the plurality of sub-pixels, respectively;
   a shielding layer disposed between the substrate and an active layer of a driving transistor among the plurality of transistors,
   a plurality of first power supply lines connected to the plurality of sub-pixels, the shielding layer disposed to intersect the plurality of first power supply line;
   a plurality of second power supply lines disposed to intersect the plurality of first power supply lines and made of the same material as gate electrodes of the plurality of transistors; and
   one or more second insulating layers disposed between the shielding layer and the plurality of second power supply lines,
   wherein the shielding layer and the plurality of second power supply lines are electrically connected through a plurality of second contact holes of the one or more second insulating layers in the non-active area, and
   wherein the plurality of second power supply lines and the gate electrodes of the plurality of transistors are disposed directly on an upper surface of one or more second insulating layers.

2. The display device according to claim 1, further comprising:
   one or more first insulating layers disposed between the plurality of first power supply lines and the plurality of second power supply lines,
   wherein the plurality of first power supply lines and the plurality of second power supply lines are electrically connected to each other through a plurality of first contact holes of the one or more first insulating layers in the active area.

3. The display device according to claim 2, wherein the plurality of first power supply lines and the plurality of second power supply lines are electrically connected to each other through a plurality of third contact holes of one or more first insulating layers in the non-active area.

4. The display device according to claim 1, wherein each of the plurality of sub-pixels includes a pixel driving circuit including an LED, a driving transistor, first to fifth transistors and a storage capacitor.

5. The display device according to claim 1, wherein in the non-active area, the plurality of first power supply lines surrounds the substrate.

6. The display device according to claim 1, wherein the first power supply lines and the second power supply lines are disposed to intersect each other in a mesh form in the active area.

7. The display device according to claim 4, further comprising:
   an encapsulation layer on the LED; and
   a touch buffer film disposed on the encapsulation layer,
   wherein the touch buffer film is made of an organic insulating material that has a dielectric constant of 1 to 3.

8. The display device according to claim 7, further comprising a touch metal on the touch buffer film,
   wherein the touch metal includes a touch sensor metal and a bridge metal located on different layers, and
   wherein a touch interlayer insulating film is disposed between the touch sensor metal and the bridge metal.

9. The display device according to claim 1, wherein in the active area, the shielding layer is electrically disconnected from the plurality of first power supply lines.

10. A display device, comprising:
    a substrate including an active area including a plurality of sub-pixels and a non-active area surrounding the active area;
    a plurality of transistors disposed in the plurality of sub-pixels, respectively;
    a plurality of power supply lines connected to the plurality of sub-pixels;
    a metal layer intersecting and connected to the plurality of power supply lines in the active area and made of the same material as gate electrodes of the plurality of transistors;
    a shielding layer disposed under the metal layer and over the substrate; and
    an insulating layer disposed between the shielding layer and the metal layer,
    wherein the shielding layer is electrically connected to the metal layer through the insulating layer in the non-active area, and
    wherein the metal layer and the gate electrodes of the plurality of transistors are disposed directly on an upper surface of the insulating layer.

11. The display device according to claim 10, wherein the shielding layer is electrically connected to the plurality of power supply lines in the non-active area.

12. The display device according to claim 11, wherein in the non-active area, the plurality of power supply lines surrounds the substrate.

13. The display device according to claim 10, wherein in the active area, the shielding layer is electrically disconnected from the plurality of power supply lines.

14. A display device, comprising:
    a substrate including an active area including a plurality of sub-pixels and a non-active area surrounding the active area;
    a plurality of transistors disposed in the plurality of sub-pixels, respectively;
    a plurality of power supply lines connected to the plurality of sub-pixels, the plurality of power supply lines being made of the same material as a source electrode or a drain electrode of a driving transistor among the plurality of transistors;
    a shielding layer disposed to intersect the plurality of power supply lines in the active area and the non-active area and electrically connected to the plurality of power supply lines in the non-active area;

a metal layer intersecting and connected to the plurality of power supply lines in the active area and made of the same material as gate electrodes of the plurality of transistors;

a first insulating layer disposed between the plurality of power supply lines and the metal layer; and a second insulating layer disposed between the shielding layer and the metal layer, wherein the plurality of power supply lines surrounds the substrate in the non-active area, wherein the plurality of power supply lines and the metal layer are electrically connected through the second insulating layer, wherein the plurality of power supply lines and the source electrode or the drain electrode of the driving transistor are disposed directly on an upper surface of the first insulating layer, and wherein the metal layer and the gate electrodes of the plurality of transistors are disposed directly on an upper surface of the second insulating layer.

15. The display device according to claim 14, wherein in the active area, the shielding layer is electrically disconnected from the plurality of power supply lines.

* * * * *